(12) United States Patent
Losiewicz et al.

(10) Patent No.: US 12,138,905 B1
(45) Date of Patent: Nov. 12, 2024

(54) AUTOMATIC ADJUSTABLE H-TOWER SUPPORT BLOCK SYSTEM FOR STENCIL PRINTER

(71) Applicant: Illinois Tool Works Inc., Glenview, IL (US)

(72) Inventors: William A. Losiewicz, Douglas, MA (US); Patsy A. Mattero, Smithfield, RI (US)

(73) Assignee: Illinois Tool Works Inc., Glenview, IL (US)

( * ) Notice: Subject to any disclaimer, the term of this patent is extended or adjusted under 35 U.S.C. 154(b) by 14 days.

(21) Appl. No.: 18/212,849

(22) Filed: Jun. 22, 2023

(51) Int. Cl.
*B41F 15/18* (2006.01)

(52) U.S. Cl.
CPC ..................... *B41F 15/18* (2013.01)

(58) Field of Classification Search
None
See application file for complete search history.

(56) References Cited

U.S. PATENT DOCUMENTS

2004/0090747 A1 * 5/2004 Wang ................. H05K 13/0069
361/719

FOREIGN PATENT DOCUMENTS

EP 0915643 A1 * 5/1999
WO WO-2017093388 A1 * 6/2017 ............. B23K 3/087

OTHER PUBLICATIONS

English language translation of EP 0915643 to Sorel et al., publication date May 12, 1999. (Year: 1999).*

* cited by examiner

*Primary Examiner* — Leslie J Evanisko
(74) *Attorney, Agent, or Firm* — Lando & Anastasi, LLP

(57) ABSTRACT

An apparatus includes a frame, a unit coupled to the frame and configured to deposit material on the electronic substrate, and a substrate support assembly coupled to the frame. The substrate support assembly is configured to support the electronic substrate. The substrate support assembly includes a worktable and a fixed support secured to the worktable. The fixed support extends from a first edge of the worktable to a second edge of the worktable. The substrate assembly further includes an adjustable support releasably secured to the worktable. The adjustable support extends from the first edge to the second edge and spaced from the fixed support. The substrate assembly further includes at least one guide mechanism configured to releasably secure the adjustable support in place on the worktable.

19 Claims, 8 Drawing Sheets

AUTOMATIC ADJUSTABLE H-TOWER SUPPORT BLOCK SYSTEM FOR STENCIL PRINTER

BACKGROUND OF THE DISCLOSURE

1. Field of Invention

This application relates generally to stencil printers and related methods to print viscous materials, e.g., solder paste, on an electronic substrate, e.g., a printed circuit board (PCB), and more particularly to an adjustable support system used to support the electronic substrate during a print operation.

2. Discussion of Related Art

In manufacturing a surface-mount printed circuit board, a stencil printer can be used to print solder paste onto the circuit board. Typically, a circuit board having a pattern of pads or some other conductive surface onto which solder paste will be deposited is automatically fed into the stencil printer; and one or more small holes or marks (known as "fiducials") on the circuit board are used to properly align the circuit board with the stencil or screen of the stencil printer prior to printing solder paste onto the circuit board. In some systems, an optical alignment system embodying an imaging or vision system is used to align the circuit board with the stencil.

Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the circuit board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste typically is dispensed onto the stencil from a standard cartridge. The stencil is then separated from the circuit board and the adhesion between the circuit board and the solder paste causes most of the material to stay on the circuit board. Material left on the surface of the stencil is removed in a cleaning process before additional circuit boards are printed.

Another process in the printing of circuit boards involves inspection of the circuit boards after solder paste has been deposited on the surface of the circuit boards. Inspecting the circuit boards is important for determining that clean electrical connections can be made. An excess of solder paste can lead to shorts, while too little solder paste in appropriate positions can prevent electrical contact. Generally, the imaging inspection system is further employed to provide a two-dimensional or a three-dimensional inspection of the solder paste on the circuit board.

It is often desirable to uniformly support the electronic substrate across a lower surface of the electronic substrate so that the entire upper surface along a plane that is co-planar with the stencil. It is known to support the electronic substrate over a substrate support or table using support blocks that have upper co-planar support surfaces.

SUMMARY OF THE DISCLOSURE

One aspect of the present disclosure is directed to an apparatus for depositing viscous material on an electronic substrate. In one embodiment, the apparatus comprises a frame, a unit coupled to the frame and configured to deposit material on the electronic substrate, and a substrate support assembly coupled to the frame. The substrate support assembly is configured to support the electronic substrate. The substrate support assembly includes a worktable and a fixed support secured to the worktable. The fixed support extends from a first edge of the worktable to a second edge of the worktable. The substrate assembly further includes an adjustable support releasably secured to the worktable. The adjustable support extends from the first edge to the second edge and spaced from the fixed support. The substrate assembly further includes at least one guide mechanism configured to releasably secure the adjustable support in place on the worktable.

Embodiments of the apparatus further may include configuring the at least one guide mechanism to move linearly along a side rail of the worktable. The at least one guide mechanism may include a U-shaped body having a first leg portion configured to ride along the side rail. The at least one guide mechanism may include a clamp guide assembly configured to releasably secure the adjustable support to the worktable. The clamp guide assembly may include a housing and a pneumatic cylinder assembly including a piston that is configured to extend and retract within the housing. The piston rod of the pneumatic cylinder assembly may be configured to move between a retracted position in which the clamp guide assembly clamps the adjustable support to the worktable and an extended position in which the clamp guide assembly lifts the adjustable support off the worktable. The piston rod of the pneumatic cylinder assembly further may be configured to de-energize from the retracted position to decouple the piston rod from the adjustable support. The pneumatic cylinder assembly may include a compression spring to bias the piston rod to the extended position. The first edge of the worktable may include a first side rail and the second edge of the worktable may include a second side rail. The at least one guide mechanism may include a first guide mechanism configured to move linearly along the first side rail of the worktable and a second guide mechanism configured to move linearly along the second side rail of the worktable. The first and second guide mechanisms may be configured to releasably secure opposite ends of the adjustable support in place. Each of the first and second guide mechanisms may include a U-shaped body having a first leg portion configured to ride along the side rail. Each of the first and second guide mechanisms may include a clamp guide assembly configured to releasably secure the adjustable support to the worktable. The clamp guide assembly may include a housing and a pneumatic cylinder assembly having a piston rod that is configured to extend and retract within the housing. The piston rod of the pneumatic cylinder assembly may be configured to move between a retracted position in which the clamp guide assembly clamps the adjustable support to the worktable and an extended position in which the clamp guide assembly lifts the adjustable support off the worktable. The piston rod of the pneumatic cylinder assembly further may be configured to de-energize from the retracted position to decouple the piston rod from the adjustable support. The pneumatic cylinder assembly may include a compression spring to bias the piston rod towards the extended position. The apparatus further may include a controller configured to control the operation of the at least one guide mechanism.

Another aspect of the present disclosure is directed to a method of releasably securing an adjustable support on a worktable of an apparatus. In one embodiment, the method comprises: positioning a fixed support on the worktable, the fixed support extending from a first edge of the worktable to a second edge of the worktable; positioning an adjustable support on the worktable, the adjustable support extending from the first edge to the second edge and spaced from the fixed support; and releasably securing the adjustable support to the worktable by at least one guide mechanism.

Embodiments of the method further may include moving the at least one guide mechanism linearly along a side rail of the worktable. The method further may include using a clamp guide assembly of the at least one guide mechanism to releasably secure the adjustable support to the worktable. The clamp guide assembly may include a housing and a pneumatic cylinder assembly having a piston that is configured to extend and retract within the housing. The piston rod of the pneumatic cylinder assembly may be configured to move between a retracted position in which the clamp guide assembly clamps the adjustable support to the worktable and an extended position in which the clamp guide assembly lifts the adjustable support off the worktable.

Yet another aspect of the present disclosure is directed to a substrate support assembly for a stencil printer. In one embodiment, the substrate support assembly comprises a worktable and a fixed support secured to the worktable. The fixed support extends from a first edge of the worktable to a second edge of the worktable. The substrate support assembly further comprises an adjustable support releasably secured to the worktable. The adjustable support extends from the first edge to the second edge and spaced from the fixed support. The substrate support assembly further comprises at least one guide mechanism configured to releasably secure the adjustable support in place on the worktable. The at least one guide mechanism may include a clamp guide assembly configured to releasably secure the adjustable support to the worktable. The clamp guide assembly may include a housing and a pneumatic cylinder assembly having a piston that is configured to extend and retract within the housing. The piston rod of the pneumatic cylinder assembly is configured to move between a retracted position in which the clamp guide assembly clamps the adjustable support to the worktable and an extended position in which the clamp guide assembly lifts the adjustable support off the worktable. When the piston rod is in the retracted position, in the event of a power loss, the pneumatic cylinder assembly is configured to lock in the retracted position to ensure the adjustable position tower does not lose position within the stencil printer.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

Figure 1:
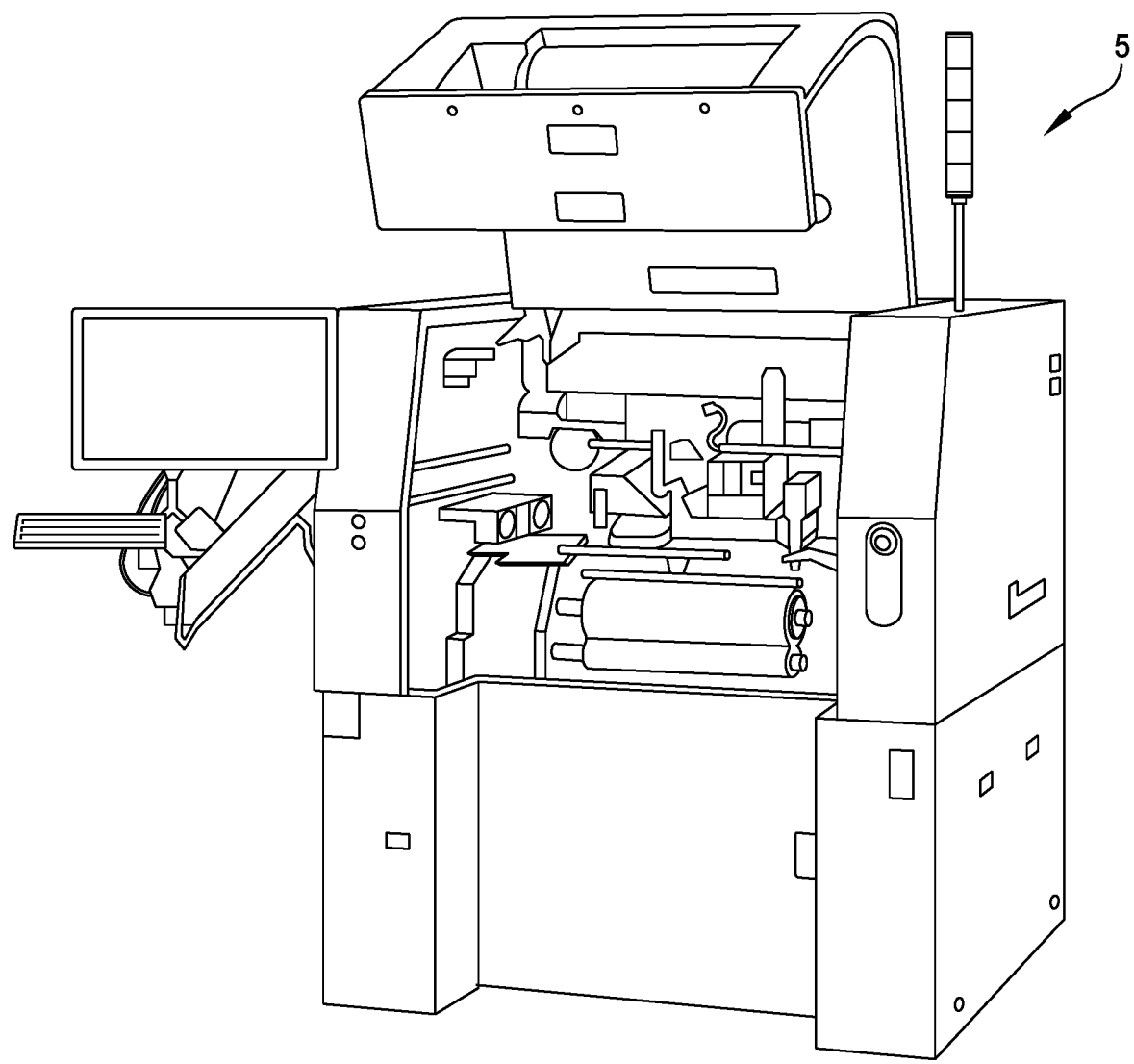
FIG. 1 is a front perspective view of a stencil printer.

The present disclosure relates generally to material application machines (referred to herein as "stencil printers," "screen printers," "printing machines," or "printers") and other equipment utilized in a surface mount technology (SMT) process lines and configured to apply an assembly material (e.g., solder paste, conductive ink, or encapsulation material) onto a substrate (e.g., a printed circuit board, referred to herein as an "electronic substrate," a "circuit board," a "board," a "PCB," a "PCB substrate," a "substrate," or a "PCB board") or to perform other operations, such as inspection, rework, or placement of electronic components onto a substrate. Specifically, embodiments of the present disclosure are described below with reference to stencil printers used to produce printed circuit boards.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

For purposes of illustration, embodiments of the present disclosure will now be described with reference to a stencil printer used to print an assembly material, such as solder paste, onto a circuit board. One skilled in the art will appreciate, however, that embodiments of the present disclosure are not limited to stencil printers that print solder paste onto circuit boards, but rather, may be used in other applications requiring dispensing of other viscous assembly materials, such as glues and encapsulants. For example, the apparatus may be used to print epoxy for use as underfill for chip-scale packages. Further, stencil printers in accordance with embodiments of the present disclosure are not limited to those that print assembly materials on circuit boards, but rather, include those used for printing other materials on a variety of substrates, such as semiconductor wafers. Also, the terms screen and stencil may be used interchangeably herein to describe a device in a printer that defines a pattern to be printed onto a substrate. In certain embodiments, the stencil printer may include a Momentum® or an Edison™ series stencil printer platform offered by ITW Electronic Assembly Equipment of Hopkinton, Massachusetts. An exemplary stencil printer is generally designated at 5 in FIG. 1. In this embodiment, the stencil printer 5 is an Edison® series stencil printer platform offered by ITW Electronic Assembly Equipment of Hopkinton, Massachusetts.

Figure 2:
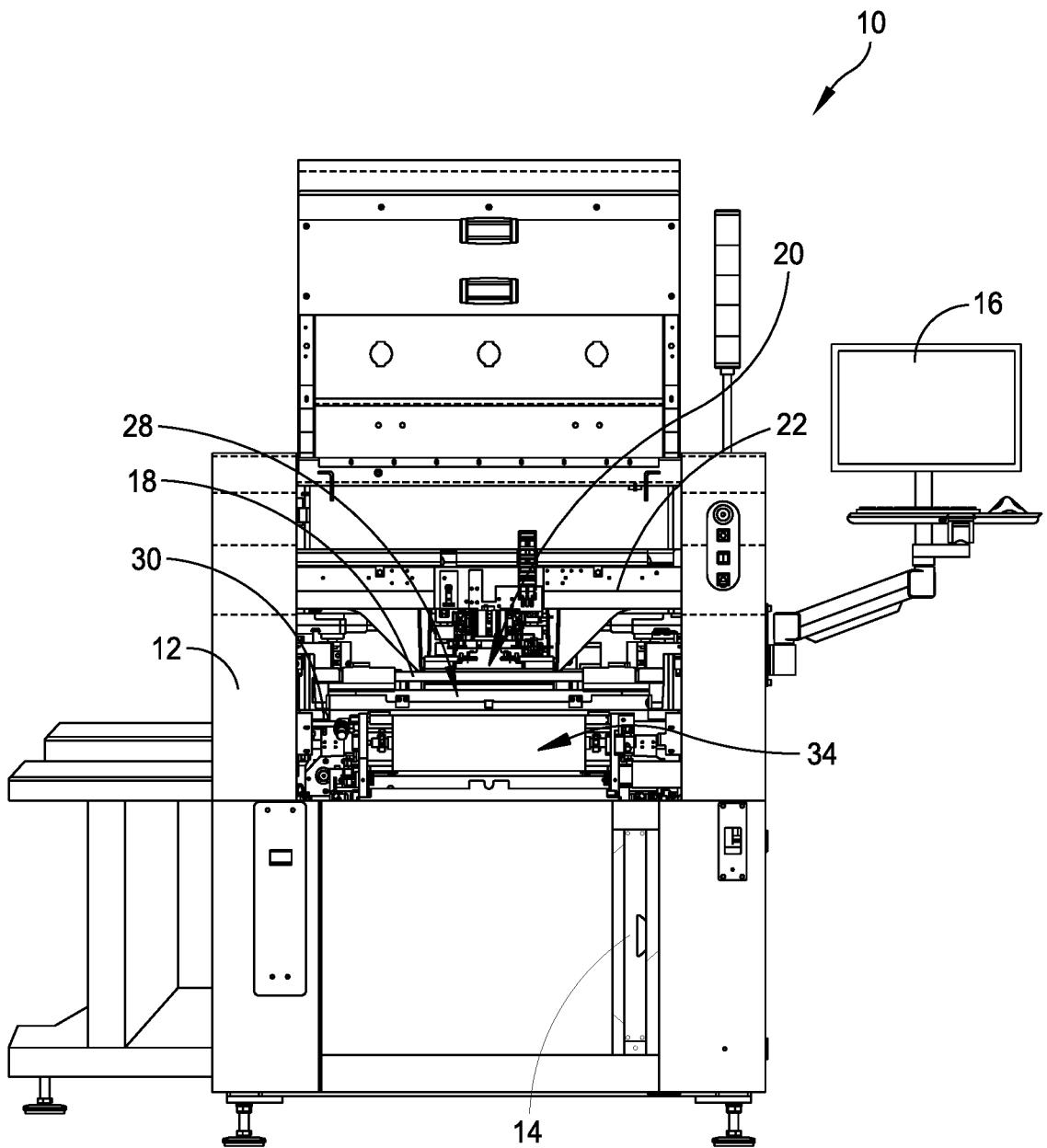
FIG. 2 is a front view of a stencil printer.

Referring to FIG. 2, there is generally indicated at 10 a stencil printer of an embodiment of the disclosure. As shown, the stencil printer 10 includes a frame 12 that supports components of the stencil printer. The components of the stencil printer may include, in part, a controller 14, a display 16, a stencil 18, and a print head or print head assembly, generally indicated at 20, which is configured to apply the solder paste in a manner described in greater detail below.

As shown in FIG. 2 and described below, the stencil and the print head assembly may be suitably coupled or otherwise connected to the frame 12. In one embodiment, the print head assembly 20 may be mounted on a print head assembly gantry 22, which may be mounted on the frame 12. The print head assembly gantry 22 enables the print head assembly 20 to be moved in the y-axis direction under the control of the controller 14 and to apply pressure on the print head assembly as it engages the stencil 18. In a certain embodiment, the print head assembly 20 may be placed over the stencil 18 and may be lowered in the z-axis direction into contact with the stencil to make a seal with the stencil.

The stencil printer 10 may also include a conveyor system having rails (not shown) for transporting a printed circuit board (sometimes referred to as a "printed wiring board," "substrate," or "electronic substrate" herein) to a print position in the stencil printer. The rails sometimes may be referred to herein as a "tractor feed mechanism," which is configured to feed, load or otherwise deliver circuit boards to the working area of the stencil printer, which may be referred to herein as a "print nest," and to unload circuit boards from the print nest.

Figure 3:
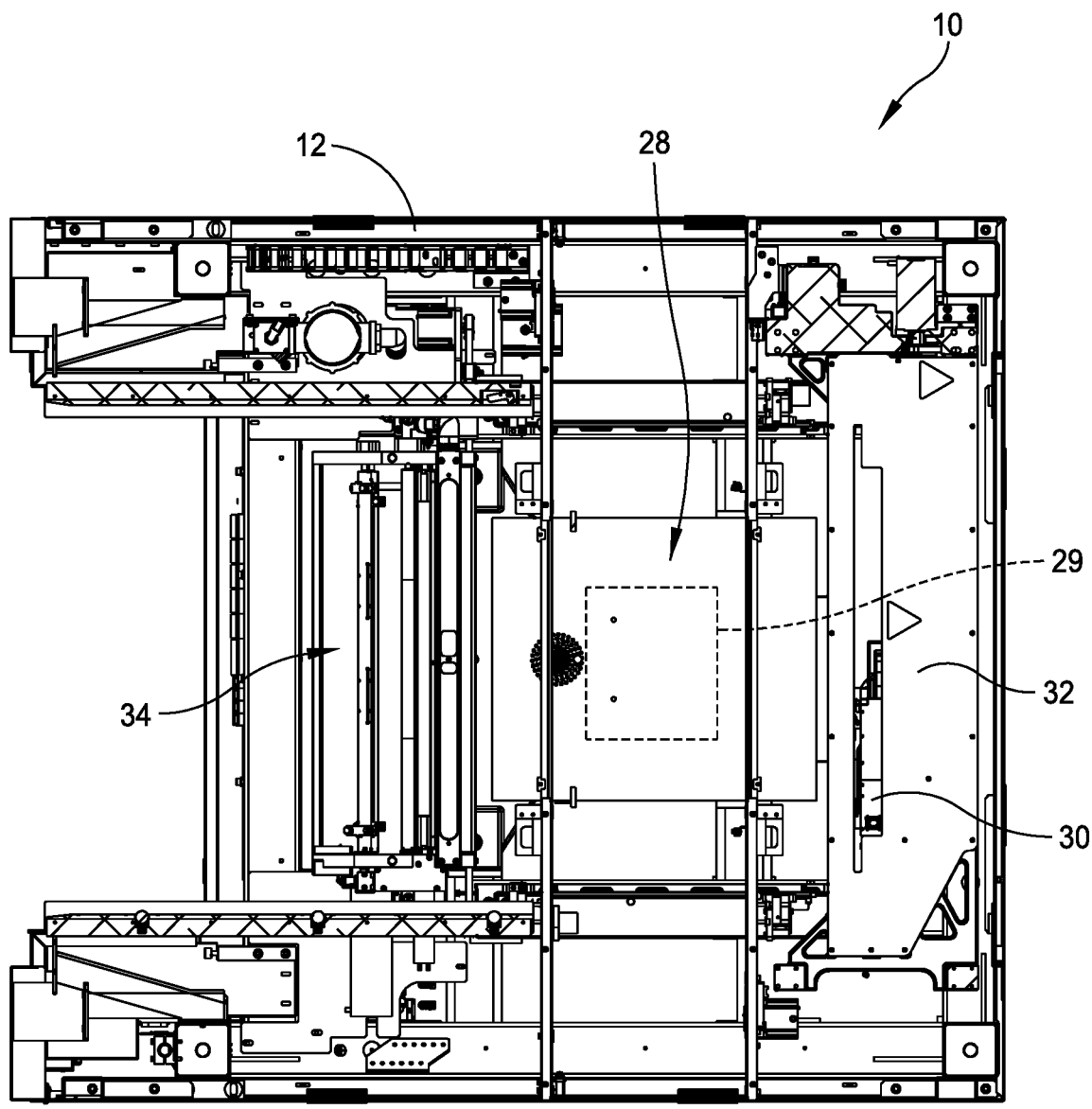
FIG. 3 is a top plan view of the stencil printer illustrated in FIG. 2 with portions removed.

Referring additionally to FIG. 3, the stencil printer 10 has a support assembly, generally indicated at 28, to support the circuit board 29 (shown in dashed lines), which raises and secures the circuit board so that it is stable during a print operation. In certain embodiments, the substrate support assembly 28 further may include a particular substrate support system, e.g., a solid support, a plurality of pins or flexible tooling, which is positioned beneath the circuit board when the circuit board is in the print position. The substrate support system may be used, in part, to support the interior regions of the circuit board to prevent flexing or warping of the circuit board during the print operation.

In one embodiment, the print head assembly 20 may be configured to receive solder paste from a source, such as a dispenser, e.g., a solder paste cartridge, which provides solder paste to the print head assembly during the print operation. Other methods of supplying solder paste may be employed in place of the cartridge. For example, solder paste may be manually deposited between the blades or from an external source. Additionally, in a certain embodiment, the controller 14 may be configured to use a personal computer having a suitable operating system, such as a Microsoft Windows® operating system provided by Microsoft Corporation, with application specific software to control the operation of the stencil printer 10. The controller 14 may be networked with a master controller that is used to control a production line for fabricating circuit boards.

In one configuration, the stencil printer 10 operates as follows. A circuit board 29 is loaded into the stencil printer 10 using the conveyor rails. The support assembly 28 raises and secures the circuit board 29 to a print position. The print head assembly 20 is then lowered in the z-axis direction until blades of the print head assembly contact the stencil 18 at a desired pressure. The print head assembly 20 is then moved in the y-axis direction across the stencil 18 by the print head assembly gantry 22. The print head assembly 20 deposits solder paste through apertures in the stencil 18 and onto the circuit board 29. Once the print head assembly has fully traversed the stencil 18 across the apertures, the print head assembly is lifted off the stencil and the circuit board 29 is lowered back onto the conveyor rails. The circuit board 29 is released and transported from the stencil printer 10 so that a second circuit board may be loaded into the stencil printer. To print on the second circuit board 29, the print head assembly is lowered in the z-axis direction into contact with the stencil and moved across the stencil 18 in the direction opposite to that used for the first circuit board.

An imaging system 30 may be provided for the purposes of aligning the stencil 18 with the circuit board 29 prior to printing and to inspect the circuit board after printing. In one embodiment, the imaging system 30 may be disposed between the stencil 18 and the support assembly 28 upon which a circuit board is supported. The imaging system 30 is coupled to an imaging system gantry 32 to move the imaging system. In one embodiment, the imaging system gantry 32 may be coupled to the frame 12, and includes a beam that extends between side rails of the frame 12 to provide back and forth movement of the imaging system 30 over the circuit board 29 in a y-axis direction. The imaging system gantry 32 further may include a carriage device, which houses the imaging system 30, and is configured to move along the length of the beam in an x-axis direction. The construction of the imaging system gantry 32 used to move the imaging system 30 is well known in the art of solder paste printing. The arrangement is such that the imaging system 30 may be located at any position below the stencil 18 and above the circuit board 29 to capture an image of predefined areas of the circuit board or the stencil, respectively.

After one or more applications of the solder paste to circuit boards, excess solder paste may accumulate at the bottom of the stencil 18 and a stencil wiper assembly, generally indicated at 34, and may move beneath the stencil to remove the excess solder paste. In other embodiments, the stencil 18 may be moved over the stencil wiper assembly.

Figure 4:
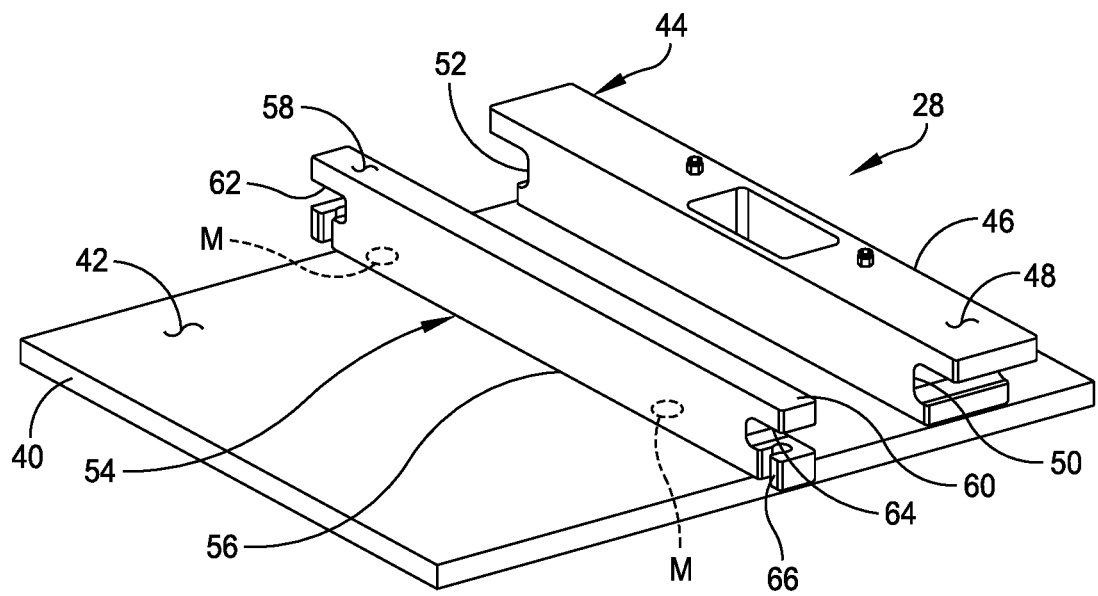
FIG. 4 is a perspective view of a support surface having a fixed support block and an adjustable support block.

Referring to FIG. 4, the support assembly 28 includes a printer worktable 40 that provides an operating surface 42 on which electronic substrates are printed upon. The support assembly 28 further includes a fixed tower, generally indicated at 44, sometimes referred to as an H-tower, which is fixedly mounted on the printer worktable 40 by locating pins provided adjacent to a fixed electronic substrate transport rail. As shown, the fixed tower 44 extends from one side of the printer worktable 40 to an opposite side of the printer worktable. The fixed tower 44 includes an elongated body 46 having an upper support surface 48 on which an electronic substrate rests when performing a print operation. As shown, one end of the elongated body 46 includes a first feature 50 and an opposite end of the elongated body includes a second feature 52. In the shown embodiment, each feature 50, 52 embodies a slot. The features 50, 52 are each configured to assist an operator in handling the fixed tower 44.

The support assembly 28 further includes an adjustable position tower, generally indicated at 54, sometimes referred to as an adjustable position H-tower, which is movable with respect to the fixed tower 44. Specifically, the adjustable position tower 54 extends in a parallel direction to the fixed tower 44, and may be moved or adjusted to position the adjustable position tower closer to or further away from the fixed tower. The adjustable position tower 54 can be configured to be coupled to and de-coupled from an adjustable electronic substrate transport rail. The support system 28 uses the adjustable electronic substrate transport rail and its drive mechanism to position the adjustable position tower 54 as needed to support various sizes of electronic substrates and substrate work holders. Additionally the adjustable position tower 54 may include a set of permanent magnets, each indicated at M, to minimize slippage of the adjustable position tower while resting on the worktable 40 when the adjustable position tower is not clamped in place.

As shown, the adjustable position tower 54 includes an elongated body 56 having an upper support surface 58 on which an electronic substrate work holder rests when performing a print operation. As shown, the upper support surfaces 48, 58 of the fixed tower 44 and the adjustable position tower 54, respectively, together support an electronic substrate work holder during a print operation. One end of the elongated body 56 of the adjustable position tower 54 includes a first receiving feature 60 and an opposite end of the elongated body includes a second receiving feature 62. As will be described in greater detail below, each of the first receiving feature 60 and the second receiving feature 62 is configured to receive a rod or pin to move and releasably secure the adjustable position tower 54 with respect to the printer worktable 40. In one embodiment, each receiving feature 60, 62, and with specific reference to receiving feature 60, includes a first slot 64 and a second slot 66, which extends in a direction transverse to the direction of the first slot 64. The second slot 66 is configured to receive the rod referenced above and described in greater detail below. The receiving features 60, 62 of the adjustable position tower 54 are provided to assist in moving a movable rail without moving the adjustable position tower 54. When controlled air pressure is dropped from pneumatic air cylinders as described below, a pin is neither engage to the adjustable position tower 54. The movable rail may be moved by its drive system to the rear of the stencil printer 10 without affecting the position of the adjustable position tower 54.

Figure 5:
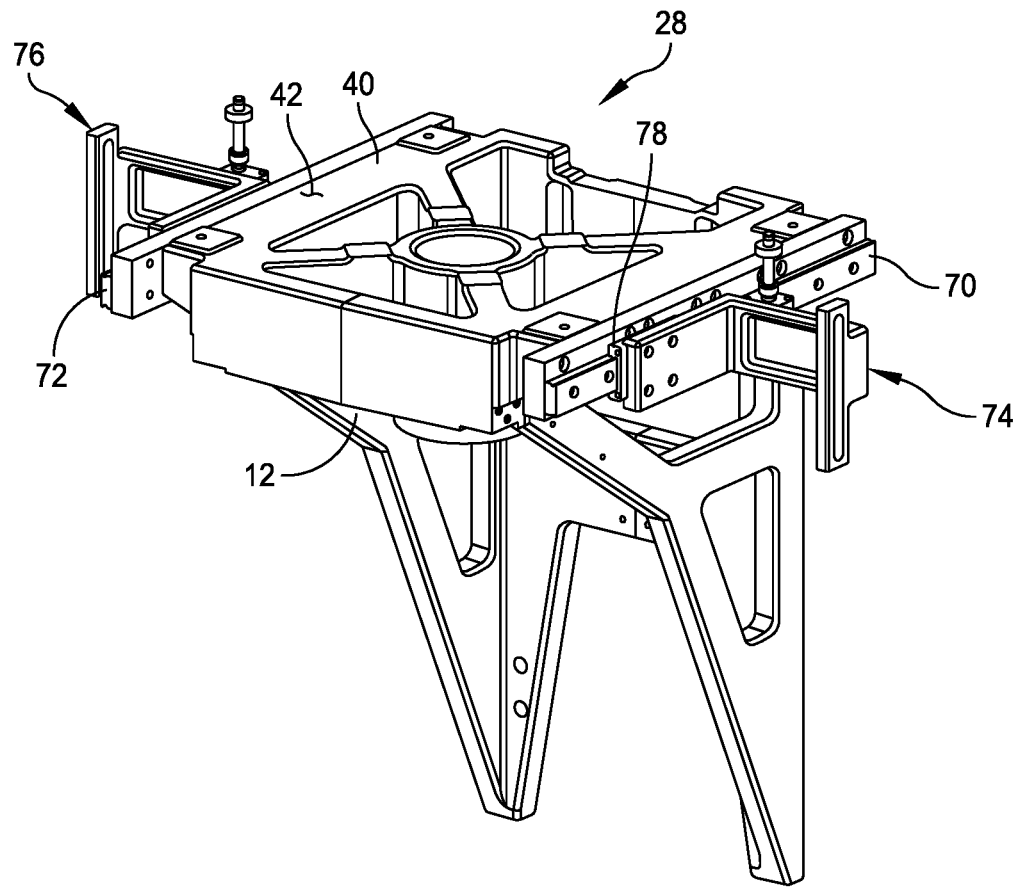
FIG. 5 is a perspective view of a portion of a support table having a righthand guide mechanism and a lefthand guide mechanism together configured to releasably engage the adjustable support block to clamp the adjustable support block to the support table.

Referring to FIG. 5, a portion of the frame 12 of the stencil printer 10 is shown. For the purposes of the following discussion about the electronic substrate support assembly 28, a portion of the frame 12 defines the printer worktable 40, which also may be referred to as a worktable casting or a worktable support. In one embodiment, the support assembly 28 includes side rails 70, 72, mounted on righthand and lefthand sides of the printer worktable 40, respectively, as shown. Each side rail 70, 72 embodies a linear bearing, which is configured to receive a carriage of a movable guide mechanism. Specifically, a righthand guide mechanism, generally indicated at 74, is provided on the righthand side rail 70 and is configured to move linearly along a length of the side rail. Similarly, a lefthand guide mechanism, generally indicated at 76, is provided on the lefthand side rail 72 and is configured to move linearly along a length of the side rail. Each of the righthand guide mechanism 74 and the lefthand guide mechanism 76 includes a carriage 78 (shown on the righthand guide mechanism) that rides along its respective side rail 70. To reposition and clamp the adjustable position tower 54, the righthand and lefthand guide mechanisms 74, 76 are mounted on the righthand and lefthand sides of the printer worktable 40, respectively, to secure both ends of the adjustable position tower. Each guide mechanism 74, 76 is configured to releasably engage its respective receiving feature 60, 62 of the adjustable position tower 54.

Figure 6:
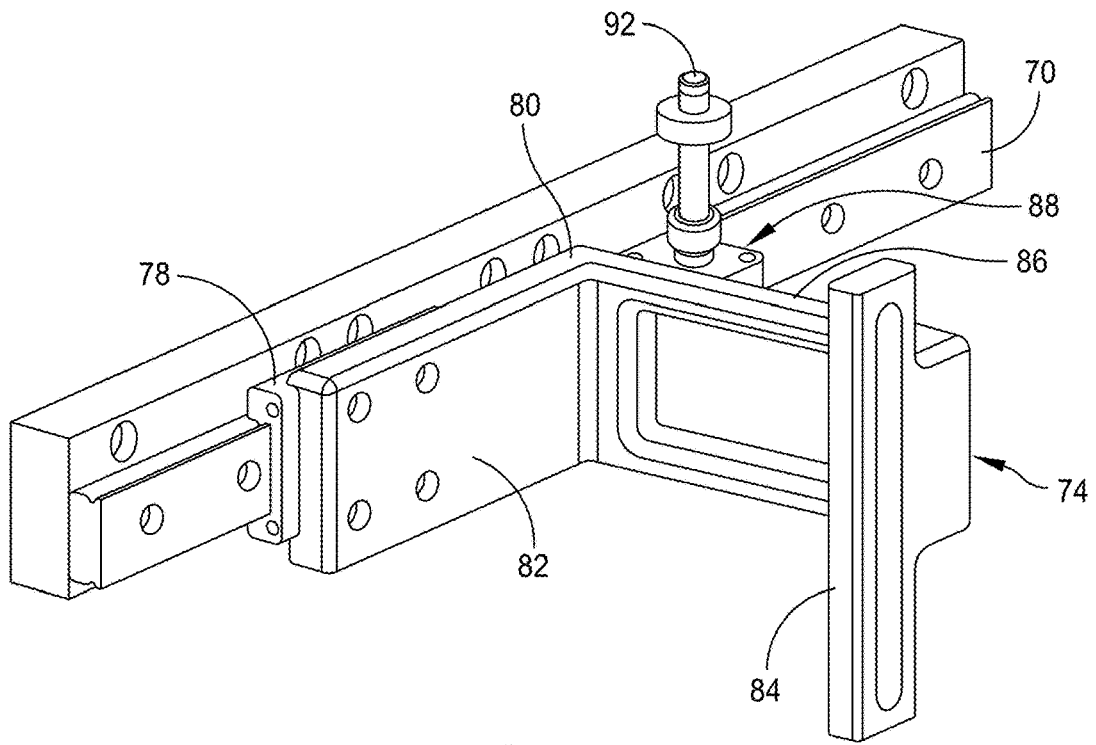
FIG. 6 is a perspective view of the righthand guide mechanism.

Referring to FIG. 6, the righthand guide mechanism 74 is shown mounted on its respective side rail 70. As shown, the righthand guide mechanism 74 includes a generally U-shaped body 80 having a first leg portion 82 configured to ride along the side rail 70, a second leg portion 84 that functions as a drive coupling to move the guide mechanism, and a bottom portion 86 configured to connect the first leg portion and the second leg portion. The first leg portion 82 of the U-shaped body 80 includes the carriage 78, which as mentioned above, is configured to ride along the side rail 70 in the well-known manner. The righthand guide mechanism 74 further includes a clamp guide assembly, generally indicated at 88, that is configured to releasably secure the adjustable position tower 54 to the printer worktable 40. As shown, the clamp guide assembly 88 is formed on or secured to the bottom portion 86 of the U-shaped body 80 and is vertically oriented with respect to the U-shaped body. It should be understood that the lefthand guide mechanism 76 is a mirror image of the righthand guide mechanism 74 and is similarly if not identically constructed as the righthand guide mechanism.

Figure 7:
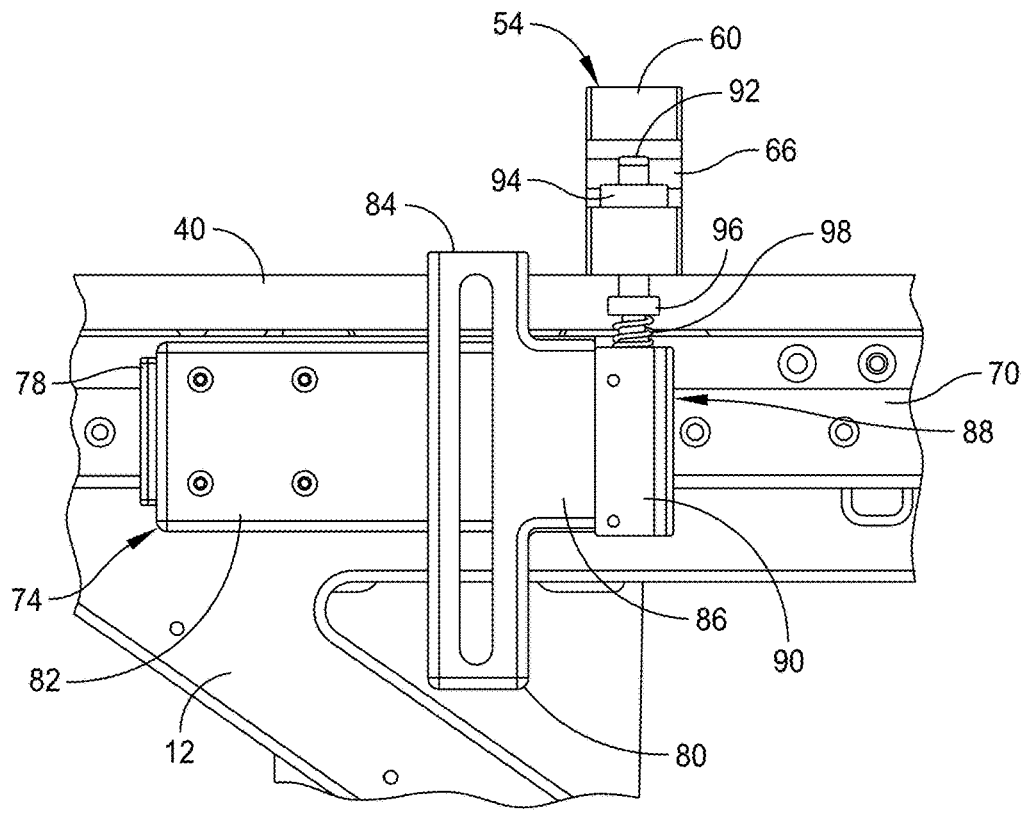
FIG. 7 is an enlarged side view of the righthand guide mechanism showing a piston of a pneumatic cylinder in a retracted position to clamp the adjustable support block to the support table.

Referring to FIG. 7, the clamp guide assembly 88 includes a housing 90 and a pneumatic cylinder assembly supported by the housing. The pneumatic cylinder assembly includes a piston rod 92, that is configured to extend and retract within the housing 90. In one embodiment, the piston rod 92 is pneumatically controlled to extend and retract within the housing 90. In a certain embodiment, the pneumatic cylinder assembly is a standard commercial double acting cylinder controlled with a solenoid valve. The head portion 94 may be configured with a threaded end which fastens to the piston rod 92 of the pneumatic cylinder assembly. The housing 90 may be formed as part of or secured to the bottom portion 86 of the U-shaped body 80 of the guide mechanism. As shown, the piston rod 92 of the pneumatic cylinder assembly is in a retracted position. In this position, the piston rod 92 of the pneumatic cylinder assembly is configured to clamp the adjustable position tower 54 to the printer worktable 40 to secure the adjustable position tower. Specifically, the piston rod 92 includes a head portion 94 that is configured to be received within the second slot 66 of the receiving feature 60 of the adjustable position tower 54. With the piston rod 92 retracted, the head portion 94 of the piston rod engages the receiving feature 60 to secure the end of the adjustable position tower to the printer worktable 40. Referring back to FIG. 4, the adjustable position tower 54 can be used with the fixed tower 44 to perform a print operation on an electronic substrate. When in the retracted position, if there is a power loss or air loss, the default pneumatic configuration of VALVE 1, VALVE 2 and PILOTED CHECK VALVE 1 (FIG. 11) is to lock the pneumatic cylinder assembly in the retracted position to ensure the adjustable position tower 54 does not lose position within the stencil printer 10 in conjunction with the magnets provided in the adjustable position tower.

Figure 8:
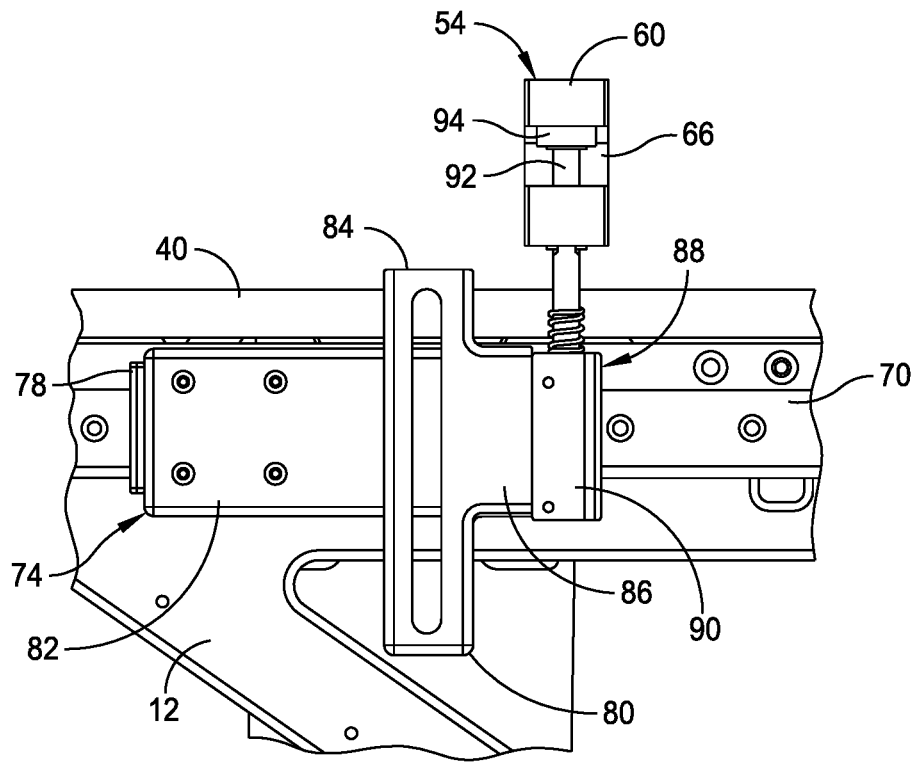
FIG. 8 is an enlarged side view of the righthand guide mechanism showing the piston of the pneumatic cylinder in an extended position lift the adjustable support block off of the support table.

Referring to FIG. 8, the piston rod 92 of the pneumatic cylinder assembly is in an extended position. As best shown in FIG. 7, the piston rod 92 of the pneumatic cylinder assembly further includes a bottom engagement portion 96, which is spaced from the head portion 94 of the piston rod. The purpose of the bottom engagement portion 96 is to engage the receiving feature 60 of the adjustable position tower 54. In this position, the pneumatic cylinder assembly is configured to lift the adjustable position tower 54 off the printer worktable 40 to reposition the adjustable position tower in the y-axis direction, either toward or away from the fixed tower 44. As shown, the pneumatic cylinder assembly further includes a compression spring 98 to bias the piston rod 92 towards the extended position. As described herein, the guide mechanisms 74, 76 are used to couple and de-couple the adjustable position tower 54 to locate the adjustable position tower in a desired position.

Figure 9:
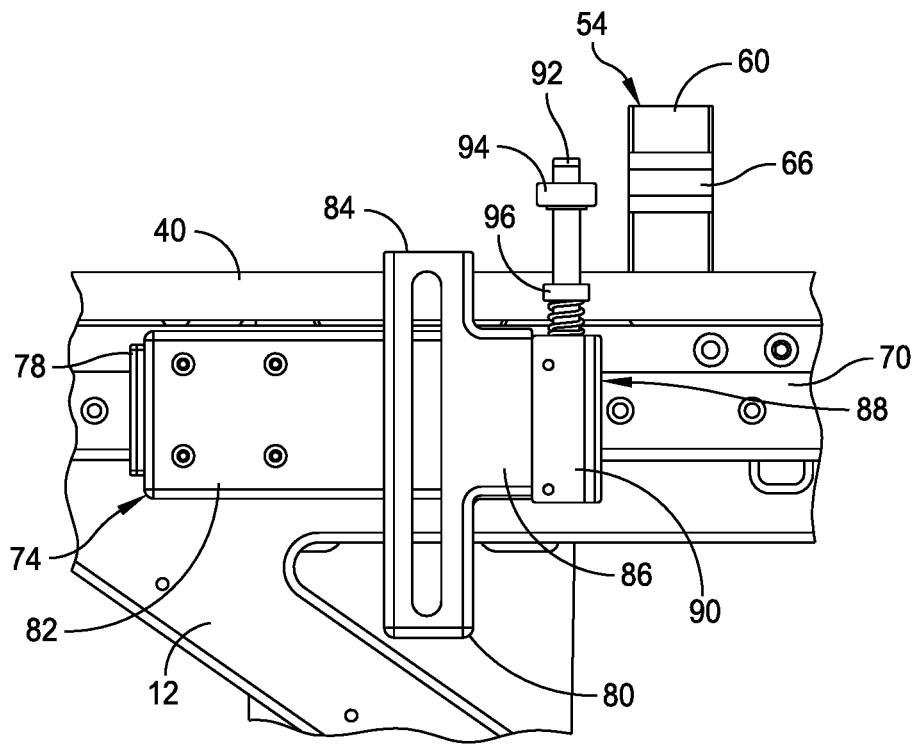
FIG. 9 is an enlarged side view of the righthand guide mechanism showing the piston of the pneumatic cylinder disengaged from the adjustable support block, with the adjustable support block resting on the support table.

Referring to FIG. 9, when the pneumatic cylinder assembly is de-energized from the retracted position (all air pressure exhausted), the compression spring 98 moves the piston rod 92 to a neutral position in which piston rod is de-coupled from the adjustable position tower 54. In this position, the guide mechanism 74 can be moved independently of the adjustable position tower 44.

Figure 10:
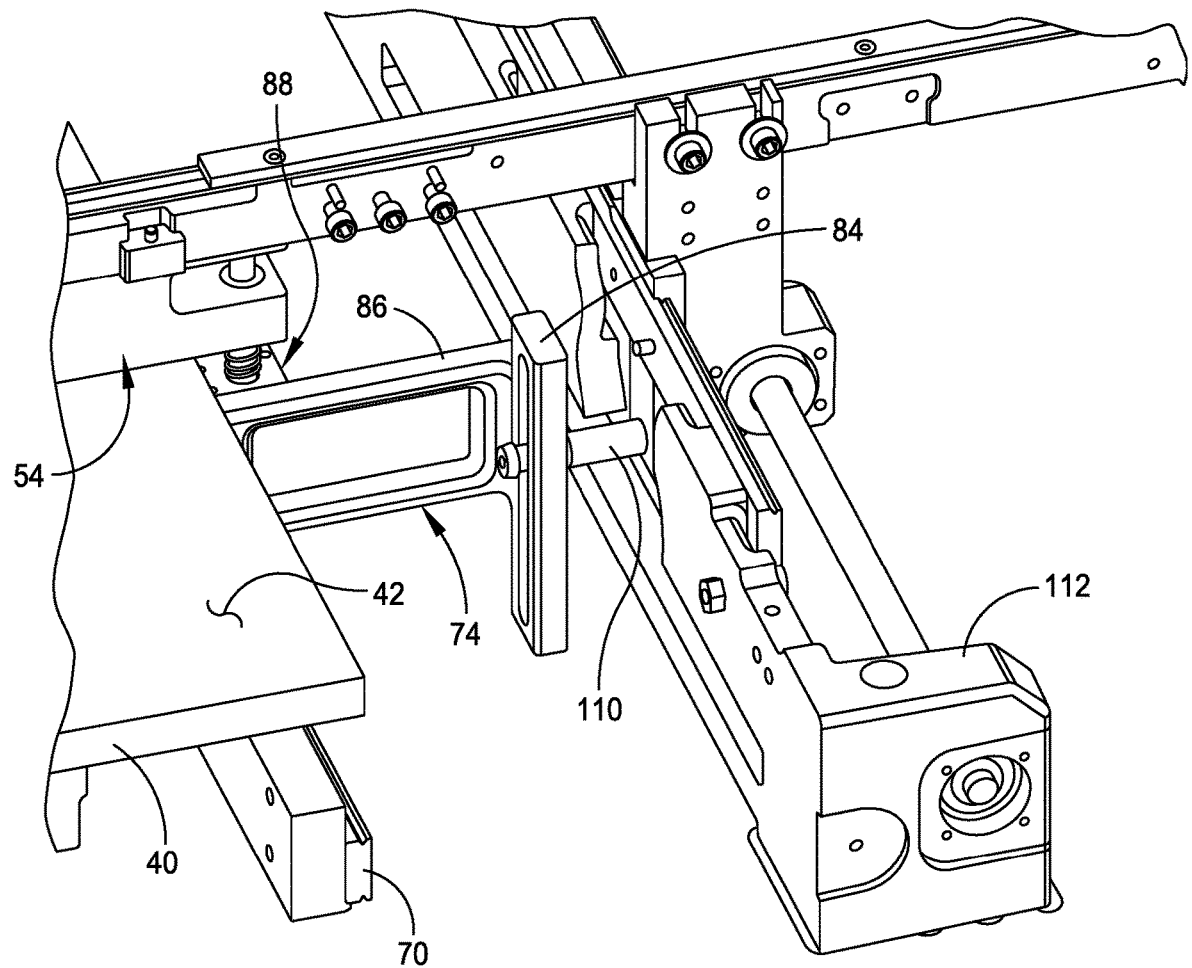
FIG. 10 is a perspective view of aspects of the guide mechanism.

Referring to FIG. 10, the righthand and lefthand guide mechanisms 74, 76 are each passive mechanisms, meaning that they have no inherent system to drive their motion along their respective side rails 70, 72. As shown, the righthand guide mechanism 74 is coupled by a coupling pin 110 to an adjustable electronic substrate transport rail 112 to drive the linear movement of the righthand guide mechanism along its respective side rail 70. The lefthand guide mechanism 76 is similarly coupled to its respective coupling pin and adjustable electronic substrate transport rail. As shown, the coupling pin 110 extends through an opening in the second leg portion 84 of the U-shaped body 80 of the righthand guide mechanism 74 to engage and move the righthand guide mechanism. The design of the components of each guide mechanism 74, 76 is in relation to its respective transport rail 112 so that when the transport rail is adjusted to a set position for a particular size of electronic substrate, the adjustable position tower 54 is also in the appropriate position to support the electronic substrate or the electronic substrate work holder.

Figure 11:
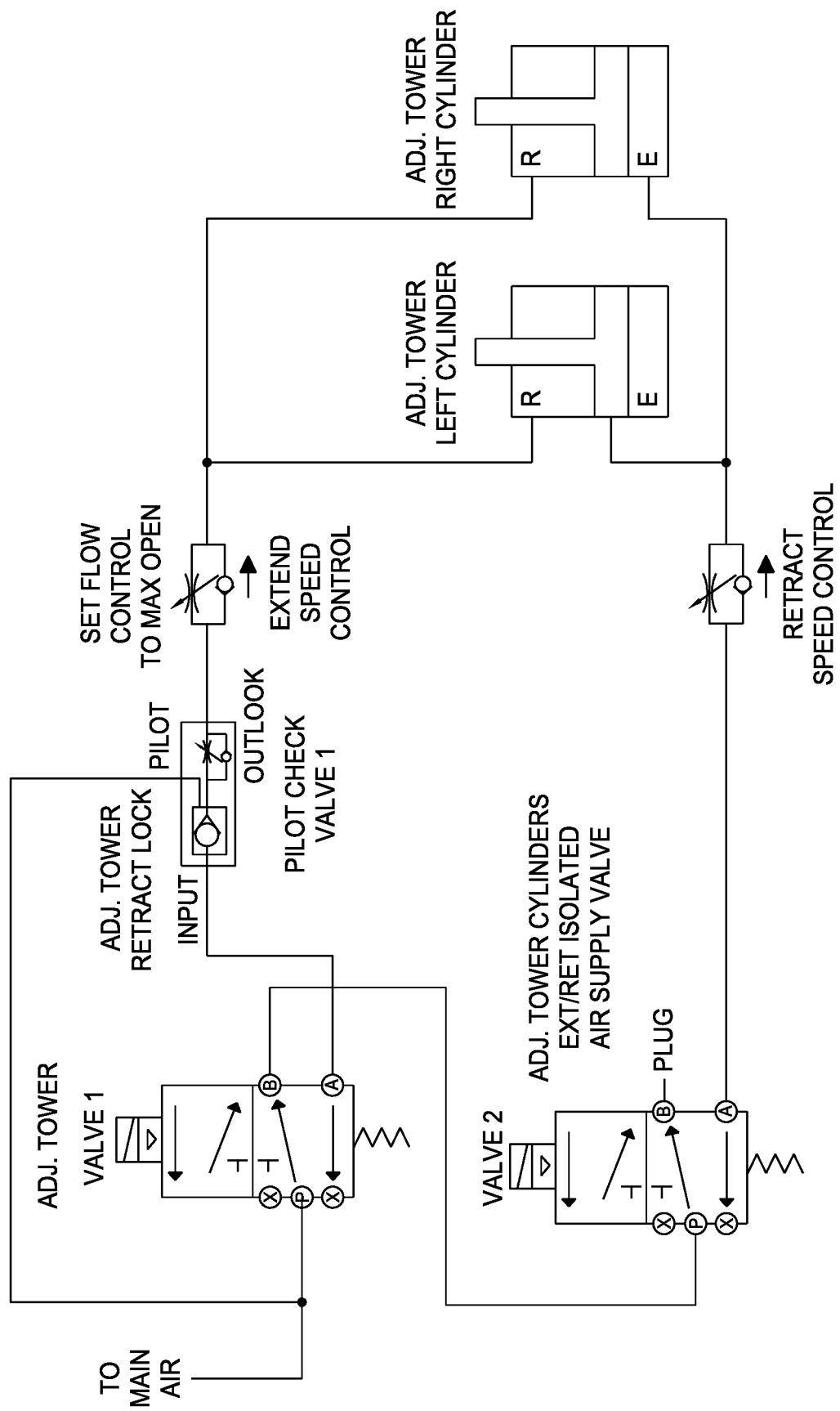
FIG. 11 is a schematic view of pneumatic cylinder assemblies of the righthand guide mechanism and the lefthand guide mechanism.

Referring to FIG. 11, the operation of the pneumatic cylinder assemblies for the righthand guide mechanism 74 and the lefthand guide mechanism 76 is shown. Main air is coupled to VALVE 1, which in turn is coupled to VALVE 2. A PILOTED CHECK VALVE 1, which is coupled to the main air, is provided to control delivery of air to the adjustable tower righthand pneumatic cylinder assembly and the adjustable tower lefthand pneumatic cylinder assembly. VALVE 1, VALVE 2 and the PILOTED CHECK VALVE 1 may be coupled to the controller 14 to control the operation of the pneumatic cylinder assemblies.

Various controllers, such as the controller 14, may execute various operations discussed above. Using data stored in associated memory and/or storage, the controller 14 also executes one or more instructions stored on one or more non-transitory computer-readable media, which the controller 14 may include and/or be coupled to, that may result in manipulated data. In some examples, the controller 14 may include one or more processors or other types of controllers. In one example, the controller 14 is or includes at least one processor. In another example, the controller 14 performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

For purposes of illustration, embodiments of the disclosure have been described with reference to a stencil printer used to print solder paste onto a printed circuit board. One skilled in the art will appreciate, however, that embodiments of the disclosure are not limited to applications with stencil printers, but may also be applicable to other types of equipment used to deposit materials onto electronic substrates. For example, the principles disclosed herein may be applied to a dispenser used to dispense viscous materials onto printed circuit boards. In addition, as mentioned above, although solder paste is referenced as being an exemplary material, other materials, such as adhesives, epoxies, under-fill materials and encapsulant materials, may be deposited as well. Also, the terms screen and stencil may be used interchangeably herein to describe a device in a printer that defines a pattern to be printed onto a substrate.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the disclosure. Accordingly, the foregoing description and drawings are by way of example only.

What is claimed is:

1. An apparatus for depositing viscous material on an electronic substrate, the apparatus comprising:
  a frame;
  a unit coupled to the frame, the unit being configured to deposit material on the electronic substrate; and
  a substrate support assembly coupled to the frame, the substrate support assembly being configured to support the electronic substrate, the substrate support assembly including
    a worktable,
    a fixed support secured to the worktable, the fixed support extending from a first edge of the worktable to a second edge of the worktable,
    an adjustable support releasably secured to the worktable, the adjustable support extending from the first edge to the second edge and spaced from the fixed support, and
    at least one guide mechanism configured to releasably secure the adjustable support in place on the worktable.

2. The apparatus of claim 1, wherein the at least one guide mechanism is configured to move linearly along a side rail of the worktable.

3. The apparatus of claim 2, wherein the at least one guide mechanism includes a U-shaped body having a first leg portion configured to ride along the side rail.

4. The apparatus of claim 2, wherein the at least one guide mechanism includes a clamp guide assembly configured to releasably secure the adjustable support to the worktable.

5. The apparatus of claim 4, wherein the clamp guide assembly includes a housing and a pneumatic cylinder assembly including a piston that is configured to extend and retract within the housing.

6. The apparatus of claim 5, wherein the piston rod of the pneumatic cylinder assembly is configured to move between a retracted position in which the clamp guide assembly clamps the adjustable support to the worktable and an extended position in which the clamp guide assembly lifts the adjustable support off the worktable.

7. The apparatus of claim 6, wherein the piston rod of the pneumatic cylinder assembly further is configured to de-energize from the retracted position to decouple the piston rod from the adjustable support.

8. The apparatus of claim 6, wherein the pneumatic cylinder assembly includes a compression spring to bias the piston rod to the extended position.

9. The apparatus of claim 1, wherein the first edge of the worktable includes a first side rail and the second edge of the worktable includes a second side rail, and wherein the at least one guide mechanism includes a first guide mechanism configured to move linearly along the first side rail of the worktable and a second guide mechanism configured to move linearly along the second side rail of the worktable, the first and second guide mechanisms being configured to releasably secure opposite ends of the adjustable support in place.

10. The apparatus of claim 9, wherein each of the first and second guide mechanisms includes a U-shaped body having a first leg portion configured to ride along the respective side rail.

11. The apparatus of claim 9, wherein each of the first and second guide mechanisms includes a clamp guide assembly configured to releasably secure the adjustable support to the worktable.

12. The apparatus of claim 11, wherein the clamp guide assembly includes a housing and a pneumatic cylinder assembly including a piston that is configured to extend and retract within the housing.

13. The apparatus of claim 12, wherein the piston rod of the pneumatic cylinder assembly is configured to move between a retracted position in which the clamp guide assembly clamps the adjustable support to the worktable and an extended position in which the clamp guide assembly lifts the adjustable support off the worktable.

14. The apparatus of claim 13, wherein the piston rod of the pneumatic cylinder assembly further is configured to de-energize from the retracted position to decouple the piston rod from the adjustable support.

15. The apparatus of claim 13, wherein the pneumatic cylinder assembly includes a compression spring to bias the piston rod towards the extended position.

16. The apparatus of claim 1, further comprising a controller configured to control the operation of the at least one guide mechanism.

17. A method of releasably securing an adjustable support on a worktable of the apparatus of claim 1, the method comprising:
   positioning the fixed support on the worktable;
   positioning the adjustable support on the worktable; and
   releasably securing the adjustable support to the worktable by the at least one guide mechanism.

18. The method of claim 17, further comprising moving the at least one guide mechanism linearly along the side rail of the worktable.

19. The method of claim 18, further comprising using the clamp guide assembly of the at least one guide mechanism to releasably secure the adjustable support to the worktable.

* * * * *